(12) United States Patent
Trontelj

(10) Patent No.: US 8,736,258 B2
(45) Date of Patent: May 27, 2014

(54) METHOD AND DEVICE FOR CONTACTLESS SENSING ROTATION AND ANGULAR POSITION USING ORIENTATION TRACKING

(75) Inventor: Janez Trontelj, Ljubljana (SI)

(73) Assignee: Maxim Integrated Products, Inc., San Jose, CA (US)

( * ) Notice: Subject to any disclaimer, the term of this patent is extended or adjusted under 35 U.S.C. 154(b) by 802 days.

(21) Appl. No.: 12/739,495

(22) PCT Filed: Oct. 25, 2007

(86) PCT No.: PCT/AT2007/000496
§ 371 (c)(1),
(2), (4) Date: Nov. 1, 2010

(87) PCT Pub. No.: WO2009/052537
PCT Pub. Date: Apr. 30, 2009

(65) Prior Publication Data
US 2011/0043197 A1    Feb. 24, 2011

(51) Int. Cl.
*G01B 7/30*    (2006.01)
(52) U.S. Cl.
USPC .................................................. 324/207.25
(58) Field of Classification Search
USPC .................................................. 324/207.25
See application file for complete search history.

(56) References Cited

U.S. PATENT DOCUMENTS

| | | | |
|---|---|---|---|
| 5,530,345 A | 6/1996 | Murari et al. | |
| 6,542,088 B1 | 4/2003 | Bielski et al. | |
| 7,208,944 B2 * | 4/2007 | Tatschl et al. | 324/207.25 |
| 7,307,415 B2 * | 12/2007 | Seger et al. | 324/207.2 |
| 7,911,203 B2 * | 3/2011 | Thomas et al. | 324/207.2 |
| 2002/0190709 A1 | 12/2002 | Frederick et al. | |

OTHER PUBLICATIONS

International Search Report, Appl. No. PCT/AT2007/000496, dated Jan. 19, 2009.

* cited by examiner

*Primary Examiner* — Reena Aurora
(74) *Attorney, Agent, or Firm* — North Weber & Baugh LLP

(57) ABSTRACT

1. Method and device for contactless sensing rotation and angular position using orientation tracking. 2.1 To improve the accuracy and possible resolution of a magnetic positioning system, a method and a device using a special tracking technique is proposed. 2.2. The method and the device are using multiple magnetic field sensing elements at different positions below a magnetic target. The sensed signals are used to select or combine the sensing elements for a best approach to the actual orientation of the magnet. This allows putting out the related orientation of the approach as a coarse value and the remaining displacement as a fine value. 2.3. A device using this method allows highly accurate measurement of angular positions controlling or tolerating the placement of a magnet as the input source.

9 Claims, 6 Drawing Sheets

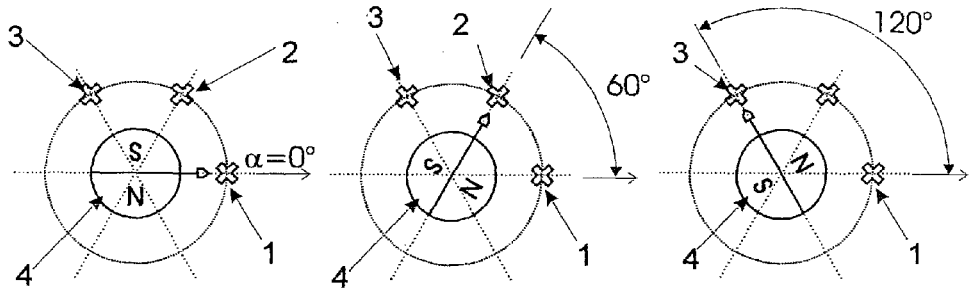
Fig. 1     Fig. 2     Fig. 3
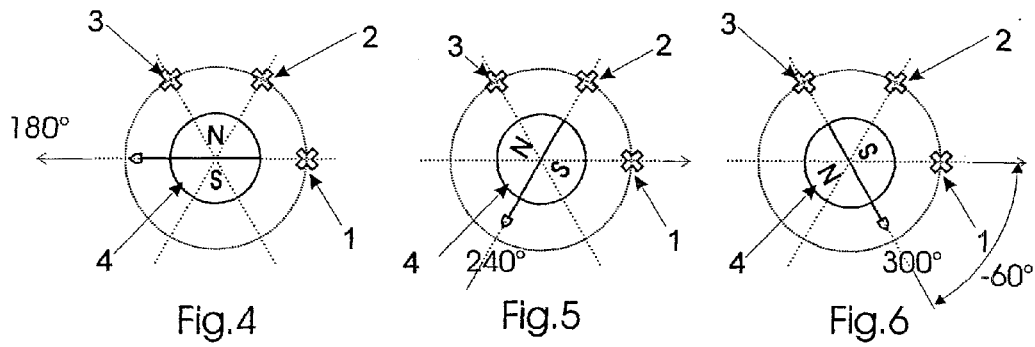
Fig. 4     Fig. 5     Fig. 6
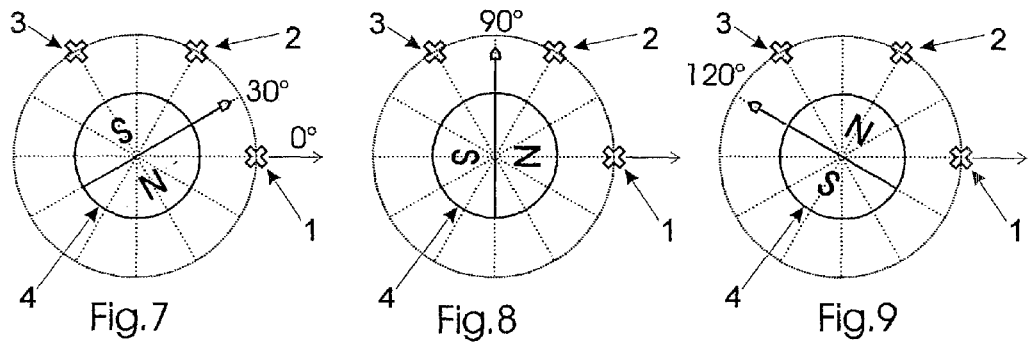
Fig. 7     Fig. 8     Fig. 9
| α/ | 0 | 30 | 60 | 90 | 120 | 150 | 180 | 210 | 240 | 270 | 300 | 330 | |
|---|---|---|---|---|---|---|---|---|---|---|---|---|---|
| $\sin(\alpha-0)$ | w | w | N | N | N | w | w | w | S | S | S | w | Sensor 1 |
| $\sin(\alpha-60)$ | S | w | w | w | N | N | N | w | w | w | S | S | Sensor 2 |
| $\sin(\alpha-120)$ | S | S | S | w | w | w | N | N | N | w | w | w | Sensor 3 |
| Position | 1 | 2 | 3 | 4 | 5 | 6 | 7 | 8 | 9 | 10 | 11 | 12 | |
| Hall-Element | 1 | 1+2 | 2 | 2+3 | 3 | 1+3 | 1 | 1+2 | 2 | 2+3 | 3 | 1+3 | |
| Factor | 1 | 1/√3 | 1 | 1/√3 | 1 | 1/√3 | -1 | 1/√3 | 1 | 1/√3 | 1 | 1/√3 | |
Table 1
Fig. 28
N:   B > 1/2*Bmax
S:   B < -1/2*Bmax
w:   Bmax/2 > B > -Bmax/2

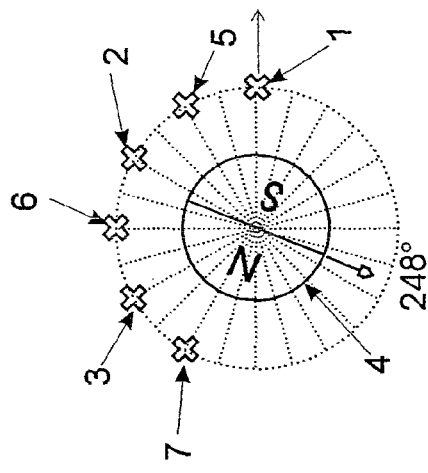
Fig.10
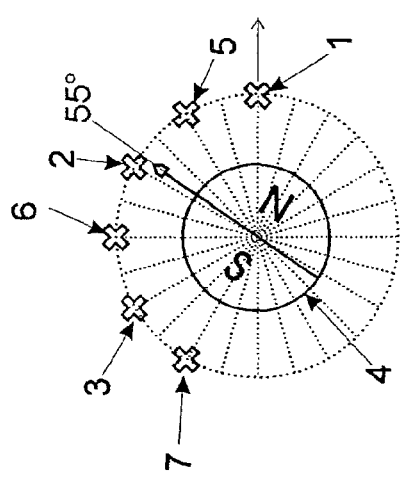
Fig.11
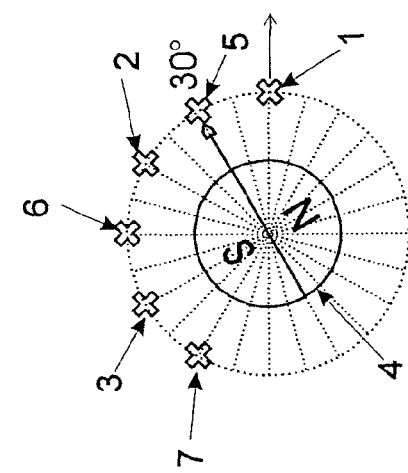
Fig.12
| α/°(degree) | 0 | 15 | 30 | 45 | 60 | 75 | 90 | 105 | 120 | 135 | 150 | 165 | 180 | 195 | 210 | 225 | 240 | 255 | 270 | 285 | 300 | 315 | 330 | 345 |
|---|---|---|---|---|---|---|---|---|---|---|---|---|---|---|---|---|---|---|---|---|---|---|---|---|
| sin(α-0) | w | S | S | S | S | S | S | S | S | N | N | N | N | N | N | N | N | N | N | S | S | S | S | S |
| sin(α-30) | S | w | w | S | S | S | S | S | S | S | S | N | N | N | N | N | N | N | N | N | N | S | S | S |
| sin(α-60) | S | S | S | w | w | S | S | S | S | S | S | S | S | N | N | N | N | N | N | N | N | N | N | S |
| sin(α-90) | S | S | S | S | S | w | w | S | S | S | S | S | S | S | S | N | N | N | N | N | N | N | N | N |
| sin(α-120) | N | N | S | S | S | S | S | w | w | S | S | S | S | S | S | S | S | N | N | N | N | N | N | N |
| sin(α-150) | N | N | N | N | S | S | S | S | S | w | w | S | S | S | S | S | S | S | S | N | N | N | N | N |
| Pos | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
| Hall element | 1 | 1+5 | 5 | 5+2 | 2 | 2+6 | 6 | 6+3 | 3 | 3+7 | 7 | 7+1 | 1 | 1+5 | 5 | 5+2 | 2 | 2+6 | 6 | 6+3 | 3 | 3+7 | 7 | 7+1 |
| Factor | 1 | A | 1 | A | 1 | A | 1 | A | 1 | A | 1 | A | 1 | A | 1 | A | 1 | A | 1 | A | 1 | A | 1 | A |
$A = 1/(2 \cdot \cos(15°))$
Table 2
Fig. 29

METHOD AND DEVICE FOR CONTACTLESS SENSING ROTATION AND ANGULAR POSITION USING ORIENTATION TRACKING

The presented invention belongs to the technical domain of electro-techniques, especially to methods and devices for non-contact sensing angle or rotation. The invented method uses the orientation of a magnetic target. Its orientation is sensed with the help of a plurality of magnetic field sensing elements, such as Hall Effect based sensing elements (Hall Elements). The sensors are integrated on a single silicon chip together with electronics for angle evaluation.

A magnetic field sensing element is able to detect the strength of a magnetic field from a magnetic target at a single local position in its local amplitude. In case of Hall Elements, also the polarity of the magnetic field can be sensed. Horizontal oriented Hall Elements have vertical magnetic field sensitivity and vertical oriented Hall Elements have sensitivity in one horizontal direction perpendicular to the surface. Non contact sensing of rotation and angular positions may be used as replacement for potentiometers in safety critical applications and for high accuracy positioning of shafts in robots.

PRIOR ART—STATE OF THE ART

Numerous magnetic field sensor devices have been published using more than one sensor within an integrated circuit. These allow sensing the magnetic field at different positions on the surface of the device. To increase the number of sensing elements allows to improve the sensitivity and accuracy of the sensor device. Existing angular encoders use a pair of orthogonal oriented sensor elements or groups of orthogonal oriented sensor elements to sense sine and cosine part of the orientation of the magnetic field vector.

U.S. Pat. No. 6,580,269 proposes a magnetic sensor device with a plurality of sensing elements in one- or two dimensional placement on an integrated circuit, in form of a linear array of sensing elements or a multiple of linear arrays. In this publication, selection means, processing and control means allow to combine different sensing elements for adapting the sensor to different sensing conditions in order to deal with bad alignment of the sensed target. This principle allows defining an optimum configuration of the sensor arrangement for a given application.

DE 103 20 057 shows a redundant implemented angular encoder with Hall Elements. Eight horizontal Hall sensor structures are placed on a circle line around a centre of symmetry with an angular distance of 45°. They form four axis of sensitivity, two orthogonal axis' are representing one angular position sensor and the remaining two a redundant sensor. The redundant sensor is used for higher reliability as a second source.

A high precise Hall sensor with a plurality of contact pairs has been published within document DE 102 40 239. The current is driven perpendicular through the horizontally oriented device surrounded by the contacts, while a free selection of the contacts can be chosen to get the fields orientation. Distortions may be eliminated by filtering the measurements of multiple opposite contact-pairs.

All existing methods described are static methods adjusting the virtual sensor element to the placement of the magnetic target and use the measurement results of the produced sine and cosine signals to calculate angular position or rotation. Methods like the known CORDIC algorithms for calculating arc tan of sensed orthogonal signals are used. All these methods results in a limited resolution, high effort for angle calculation and higher power consumption, the calculation time results in a measurement delay of the position at rotation and thus synchronism at rotation.

TASK OF THE INVENTION

Based on existing technologies presented in the literature quoted above, a method and a design according to that method was looked for, allowing even higher precise measurement of absolute angle and rotation of a shaft with higher speed, using non contact sensing technologies that are robust and reliable.

The evaluation of the relative orientation of a magnetic target to the orientation of integrated circuits shall be done in a way which is comparable to Phase Locked Loop designs at frequency generators, modulators and demodulators. A sensed orientation of the external magnetic field shall be tracked fast by keeping the phase difference constant. The phase difference shall be constant and could be simple corrected by adding offset angle values. In order to avoid movable parts within the integrated circuit that follow the field physically, multiple sensor elements shall be used instead.

The orientation and if necessary a linear displacement of the external field shall be sensed using a best fitting combination of sensing elements. Selecting means shall directly feed back the sensed orientation to perform an orientation-matching combination of the sensor elements. The calculated vector orientation shall be as parallel as possible to the sensed orientation. Remaining misalignment shall be represented as a signal that is proportional to the misalignment.

The maximum number of coarse orientation values should be represented by the absolute location of the sensors together with all possible combinations of them on the integrated semiconductor device. This number reflects the maximum coarse resolution of the sensor. The measurement delay shall be as low as possible with incremental orientation adjustment.

SUMMARY OF THE INVENTION

The tasks of the invention are solved by the invention characterized in the presented claims. The shown method allows sensing rotation and angular position using a plurality of magnetic field sensing elements on a single integrated circuit. Tracking of the orientation of a rotating movable magnetic target is performed by a coarse determination of the magnet's orientation and eventually its rotational axis relative to the sensor elements in a first step. This step may be done during an initial phase at the beginning of a number of sensing cycles. It could also be done at every measurement period. This primary step is similar to prior art measurement methods: A plurality of signals of magnetic field sensing elements are arithmetically and/or logically combined and the value of the angle is calculated or determined out of the knowledge of the sensor elements physical position. Each sensor-element may have stored an address that includes its position on the integrated device area. A reference point on the integrated circuit like the centre of the device may be used together with every single sensor element to specify a basic orientation. Alternatively combined signals of two ore more sensor elements may specify orientations.

Two options are possible for the next step of the invented method:

In the first option each sensor signal is compared to each other sensor signal. The element with the lowest angular distance to a predefined orientation axis or half-axis of the magnetic target is chosen for sensing the remaining displacement.

In the second option a plurality of magnetic field sensing elements is combined arithmetically or logically to define a sensing orientation that has smallest angular misalignment to the predefined orientation axis or half-axis of the magnetic target.

The resulting signal out of—either this chosen sensor element—or the chosen sensor element combination, represents the misalignment. A preferred orientation may be the zero-passing due to a North-South pole transition or a South-North pole transition. The misalignment signal represents a signal close to a sine-wave deflection at the value 0° or 180° whose gradient is close to 1 or –1 allowing correctable misalignment error.

It must be presumed that one 360° rotation results in an exact sine-wave signal-output at the chosen sensor element or sensor element combination.

In case of the usage of Hall Effect Sensors, each magnetic field sensing element on the integrated circuit either senses a north polarity or a south polarity. A weak signal at a single sensor indicates the magnetic targets polarity separation plane. Combining two or more sensor elements that senses magnetic field strengths with opposite signs, and the sum of the amplitudes result in a value that is close to zero is another method tracking the polarity separation plane of the magnetic target. E.g. one sensor is sensing the magnetic North while the other is sensing the magnetic South of the magnetic target, and the fields are of the same Amplitude, the polarity separation plane of the magnetic target is represented parallel to the axis which is the symmetry axis of the distance between the two sensors. All other combinations can be performed by vector-algebra.

A simple method of determine coarse orientation is sensing the polarity of the magnetic target at a plurality of magnetic field sensing elements. To use three possible states per sensor: North (N), South (S) and Weak (w) Signal will lead to a truth table, out of that the best matching orientation can be derived.

A further method for orientation determination is to detect an extreme value or a zero-crossing by comparing the amplitude of each sensing element with a threshold or a window comparator that is concerning not more than two sensor elements or by comparing the amplitude of each other sensing element and using the related angular position value.

Detecting of an extreme value or a zero-crossing with the help of taking a combination value of a plurality of magnetic field sensing elements to a predefined threshold or amplitude window may increase the accuracy. The comparison with values of other combinations of the sensing elements can be used to find the corresponding angular position value.

Every sensor or sensor combination may have a corresponding digitally represented absolute angular position value represented in a stored table, with the accuracy of the layout and its lithographic processing.

The combination of magnetic field sensing elements may be performed by analog summation or analog subtraction of the outputs of selected sensing elements. The resulting signals may be Analog to Digital converted for further processing in a digital computing system like a micro-controller or microprocessor on the integrated circuit. The signals of each sensor may be weighted or unified—resulting in different equal vector sizes.

A special evaluation is given by separating a plurality of sensor elements in two half sectors which are localized opposite to two neighbouring quadrants of the magnetic target. The signals of each sensor element's output of the two groups of sensors are added, which result in two sums. The result of each summation corresponds to the mean value of the magnetic field of two neighbouring quadrants of the rotating magnetic target forming a sine and a cosine signal. CORDIC analyses or other known methods may be used to calculate the coarse angle as a function of the arc tan of the two signals.

Instead of the two quadrant method also a four quadrant method may be used. This increases the necessary device area, signal amplitude and the signal to noise ratio.

In this case a plurality of sensor elements is separated into four quadrants. The summation signal of the sensor elements within the first two quadrants, equal to one half of the sensor carrying area, minus the summation signal of the sensors in the second two quadrants, that are representing the other half of the area, form a first signal. The sum of the signals of the sensor elements in the second and third quadrant minus the sum of the signals of the first and fourth quadrant form a second signal which is orthogonal to the first signal. In this case all sensors of one quadrant sum up the different magnetic field strengths of one quarter of the magnetic target. This results in very exact images of a sine and a cosine signal with respect to the position of the magnet above, below or within a location quite close to the centre of the quadrants at the two signal outputs. The evaluation of the angle may be done as described above.

Knowing the coarse angular position through the methods described above, their digital representation is directly used to switch by a control unit to one magnetic field sensing element whose orientation is as close as possible to the orientation of the magnetic target. Alternatively a new combination of magnetic field sensing devices is switched, performing a sine-wave signal close to the angle zero.

If the coarse angular estimation is performed only in the initial phase an incremental method using an upper and a lower threshold of the remaining misalignment may be used to decide a switching to the neighbouring sensor element or to a combination of the sensor elements that represents the closest neighbouring anglular orientation.

A large number of angular values needs a large table of switching configurations. Alternatively an iterative method may be used approaching the actual angle by setting and resetting the position defining bits starting from the Most Significant Bit (MSB) down to the least significant bit. This is done by starting with separating the magnetic sensitive elements into two groups within two halves of the sensor area. The electronics detects the side that is closer to the north pole of the magnet; the evaluation bit is the Most Significant Bit. Then, the separation axis is virtually rotated by plus or minus $360/2i$ where i is the number of the iterative step. Depending on the evaluation result of each step, the lower bits are set to zero or one.

Using the invented method an integrated circuit is presented allowing sensing of rotation and angular position using a plurality of magnetic field sensing elements. The device comprises means to determine coarse orientation of the magnetic target relative to a number of magnetic field sensing elements, means for selecting one sensing element or one combination of a plurality of sensing elements depending of the determined coarse orientation and means for computing remaining misalignment of the magnetic target after the selection.

Advantageous is the implementation of Hall Effect Sensors as magnetic field sensing elements, including peripheral structures to perform pre-amplifications and offset eliminating methods like current spinning.

The placement of the sensing elements is done in form of a two dimensional array. This could be on equidistant Cartesian coordinates with rows and columns of sensors or in Polar coordinates with at least one fraction of a circle of sensors in equidistant angles.

The magnetic field sensing elements are assigned to at least two neighbouring quadrants of a magnetic target.

A number of P sensors could be positioned at a radius R on half circle line with an angular distance close or similar to radiant $\pi/P$ or the P sensors are positioned on a full circle with an angular distance close or similar to radiant $2\pi/P$.

If only a half circle is used, P sensors are placed only in a 180° area related to the magnets placement. This implementation may use a sensor-signal comparator and a selector for the sensor-output with the lowest signal amplitude, the selector having an address output that is representing the coarse angular value of the half circle. A further comparator is required to get the North-South orientation of the magnetic target to enable 360° signal functionality. In this case processing means are implemented to get remaining misalignment of the sensor. This may be an amplifier or A/D converter and signal error correcting tools for linearization, like a look up table or a nonlinear amplification.

Using P sensors in the full 360° range, the magnetic field sensing elements are preferably equidistantly placed on at least one circle line below or above the magnets placement. This implementation uses means for adding the output signals of one half of the sensor elements (element 1 to element P/2 within 0 and $\pi$ rad (=$H_{10}$)). This is located in a first defined half plane. The remaining half of sensor elements ((element P/2+1) to element P within $\pi$ and $2\pi$ rad (=$H_{20}$)) are located in the second defined half plane. Further two sum-signals are derived form the sensors located in two half planes that are oriented 90° in relation to the first two planes (from element P/4+1 to element 3P/4 within $\pi/2$ and $3\pi/2$ rad (=$H_{30}$) and from element (3P/4+) to element P plus element 1 to element P/49 within $-\pi/2$ and plus $\pi/2$ rad (=$H_{40}$). Calculation means allow to compute the arc tan of $$(H_{10}-H_{20})/(H_{30}-H_{40})=\sin\alpha_0/\cos\alpha_0.$$

The result is the actual orientation phase difference $\alpha_0$ between the selected orientation of the virtual sensor and the actual orientation of the magnetic target.

Means for calculating are used to get the new orientation for the two separation axis. This is represented by four groups of sensor elements. Each group is combined by adding the output signals of its sensors. P sensors on a circle allow 2P orientations, starting combining sensor number 1 to sensor P/2 and P/2 to P. The next combination adds the outputs of sensor number 2 to sensor P/2 and of sensor number P/2+2 to sensor P and so on. The last combination is combining the signal of sensor 1 to sensor P/2–and P/2+to P–1. Due to symmetry conditions the switching condition of one quadrant must be processed, since the remaining signals may be derived by changing the sign of the summation results. For this reason only P/2 switch configurations are required to get 2P possible coarse virtual sensor configurations.

Based on the result of coarse sening of the misalignment $\alpha_0$, the required combination value n is calculated.

$$\text{Combination } n=\alpha_0/\delta$$

where
$\delta$ is $\pi/P$ with maximum 2n configurations, and $\delta$ is the angular increment size.

The resulting configuration is given by summing the signals of the magnetic field sensing element given by int(n/2+1) to sensing element number [P/2+int(n/2–1)] within $\alpha_0$ and $\pi+\alpha_0$ rad (=$H_{1n}$), and sensing element number [P/2+int(n/2+1)] to sensing element number P and if n≥2 adding the signals of element from 1 to int(n/2–1)] within $\pi+\alpha_0$ and $2\pi+\alpha_0$ rad (=$H_{2n}$)

for the cosine representation calculated with $H_{1n}-H_{2n}$.

Further summing signals of the magnetic field sensing element [P/4+int(n/2+1)] to element 3P/4+int(n/2–1) within $\pi/2+\alpha_0$ and $3\pi/2+\alpha_0$ rad (=$H_{3n}$) and [(3P/4+int(n/2+1)) to P and from int(n/2+1) to P/4+int(n/2–1)] within $-\pi/2+\alpha_0$ and plus $\pi/2+\alpha_0$ rad (=$H_{4n}$)

for the sine representation calculated with $H_{3n}-H_{4n}$.

For very small misalignments the 1$^{st}$ approximation is: $\sin\alpha_r\approx\alpha_r$, where $\alpha_r$ represents the remaining misalignment of the tracking.

If n>P also the alternative configuration $n_1$=n–P can be used instead, but the sign of cosine and sine representations must be inverted.

If P>n>P/2 also the alternate configuration $n_2$=n–P/2 can be used, but the sign of sine signal must be inverted.

The innovation is detailed described in following preferred embodiments:

FIG. 1 to FIG. 9 show equidistant angular placement of three Hall Elements 1,2,3 on the edge of a half circle around a diametrically magnetized cylindrical magnet 4 at 0°, 60° and 120°.

FIG. 10 to FIG. 12 give positioning examples using six Hall Elements 1,2,3,5,6,7 at 0°, 30°, 60°, 90°, 120° and 150°.

Figure 16:
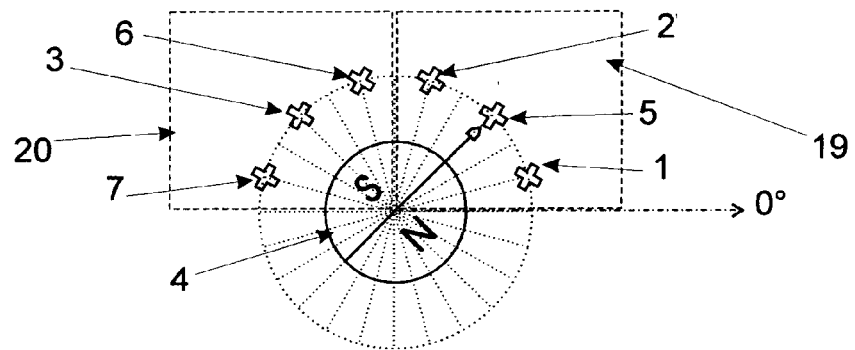

FIG. 16 shows the combination of three by three Hall Elements at the angles 15°, 45°, 75° and 105°, 135° and 165° for interpolating two orthogonal quadrants of the magnetic target.

Figure 17:
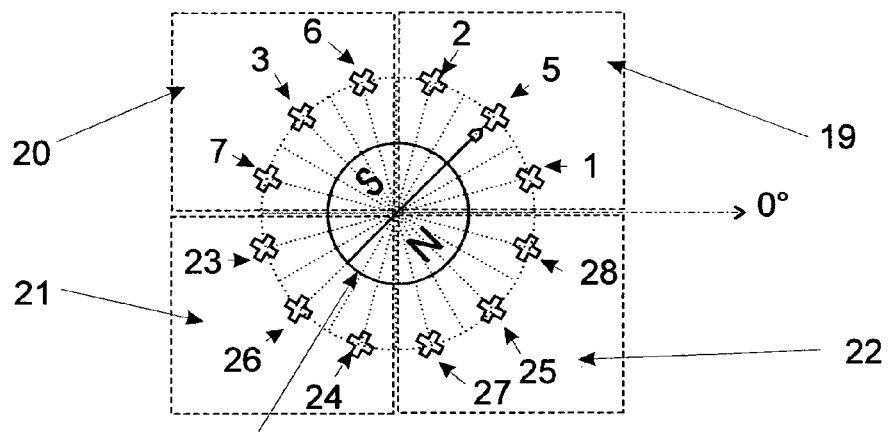

FIG. 17 shows 12 Hall Elements equidistantly oriented on a circle line in an initial orientation to a magnet.

Figure 18:
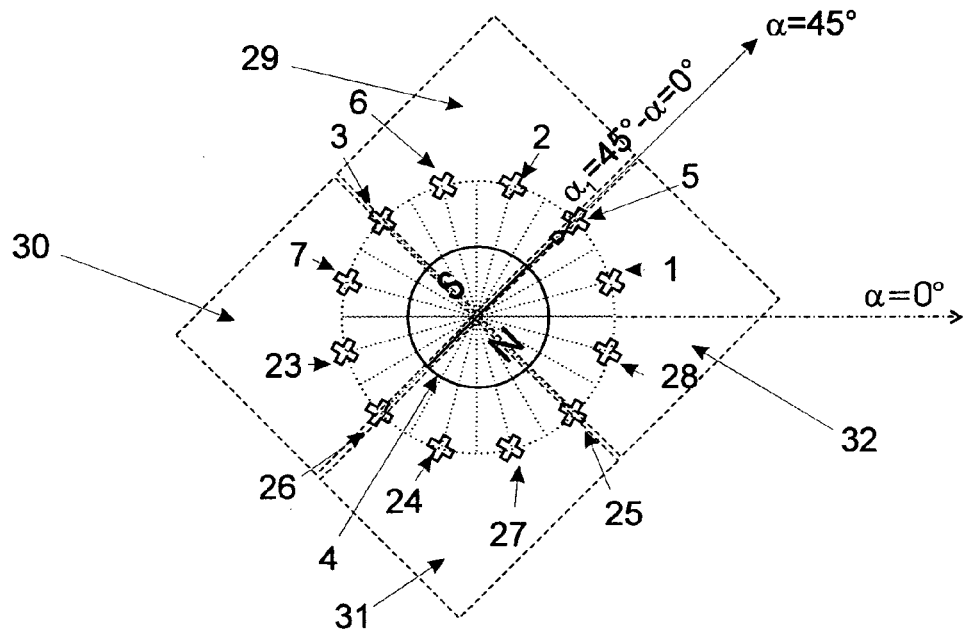

FIG. 18 shows the application of FIG. 17 after a coarse orientation evaluation with adapted orientation.

Figure 19:
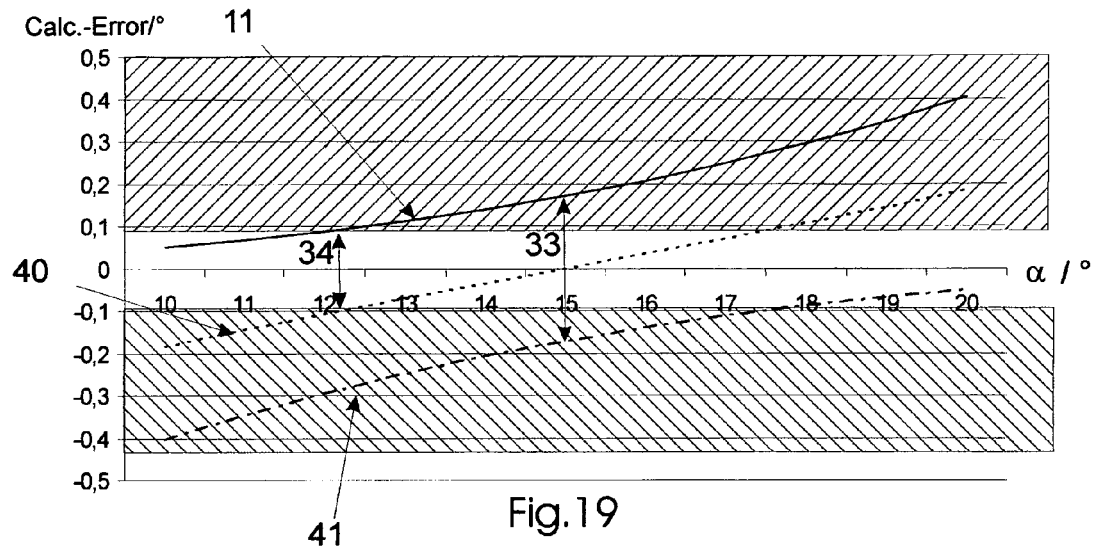

FIG. 19 is a graph that shows the approximation error using intermediate positions between six Hall Elements 1,2,3,5,6,7

Figure 20:
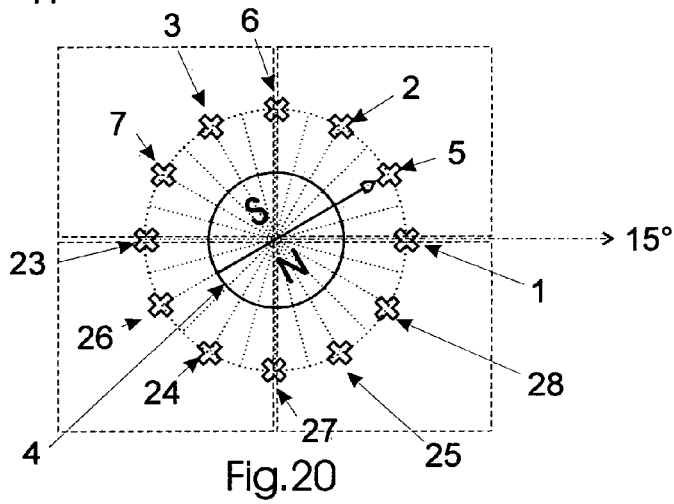

FIG. 20 shows the Hall Elements of FIG. 17 in a 15° rotated coordinate system.

Figure 21:
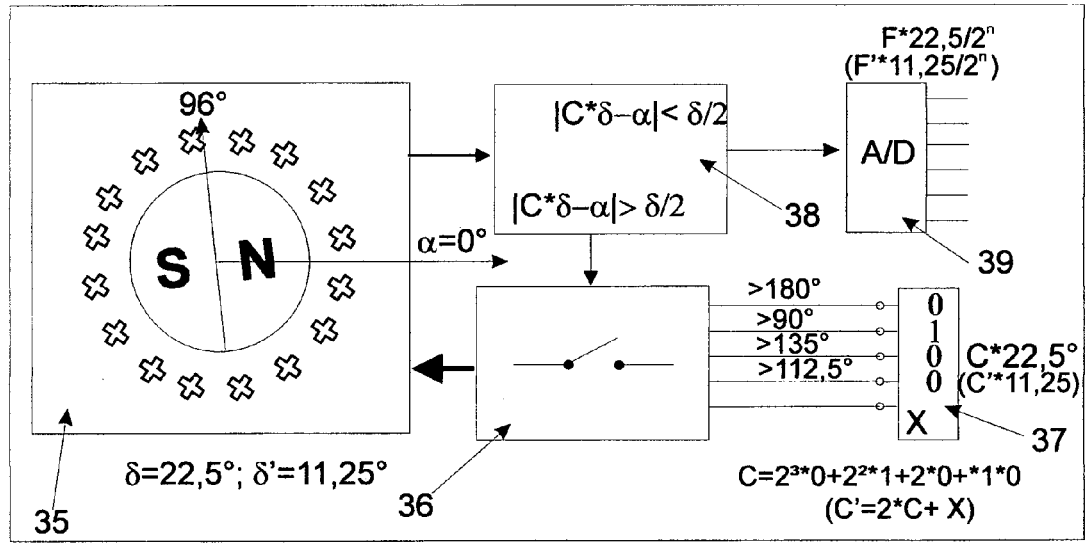

FIG. 21 shows a block diagram of an integrated sensor device according to one embodiment of the present invention.

FIGS. 22-26 show multiple sensors rotated at angles 96°, 270°, 45°, 22.5°, and 101.25° with respect to a reference position, respectively.

Figure 27:
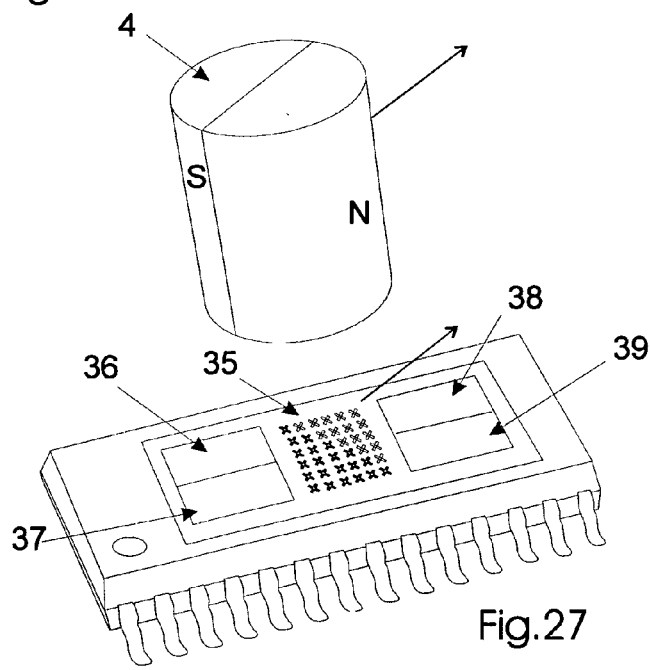

FIG. 27 shows a perspective view of an integrated sensor device according to another embodiment of the present invention.

FIG. 28 shows Table 1.

FIG. 29 shows Table 2.

If a magnet 4 is placed as shown in FIG. 1, the zero reference orientation may be the positive x-direction showing to the left side of the sheet. The rotation axis of the magnet is orthogonal to the sheet and goes through the centre of the magnet and its magnetic separation plane. Three Hall Elements may be arranged at the angles 0°, 60° and 120° relative to the zero-orientation axis counter-clockwise around the magnet. With this constellation six coarse angular positions are available showing a zero-passing at one of the three Hall Elements (0°, 60°, 120°, 180°, 240° and 300°; see FIG. 1 to FIG. 6). Combining the signals of the three Hall Elements 1,2,3 with 3-state analysis (O,N,S) allows a unique allocation of the magnet's orientation. If e.g. the orientation of the magnet relative to the zero angle is 55°, an arithmetical or logical unit will define a new zero orientation that is shifted by +60°. A switching logic will select Hall Element 2 as closest for a tracked sine signal. The remaining amplified signal is equal to $$A\cdot\sin)(-5°)=-0.087\ A, (5°=(5/180)\cdot\pi\ rad=0.087\ rad),$$

where A is the sensitivity of the element times the gain. For very small angular misalignments it is possible to make a first approximation with $\sin(\alpha)\approx\alpha$. At five degree, the approximation error is less than 0.13% or less than 0.0064°. Using only six coarse positions causes a maximum deflection of +/−30° around one coarse position. Without error calculation the maximum of the nonlinearity error would be approx 30°−arc sin 30°=0.524 rad−0.5 rad=0.024 rad or 1.35° at +/−30° or +/−4.72% (see also FIG. 15, Error 17 at 30°)

Defining also positions exactly between two Hall Elements would lead to twelve absolute coarse positions with an angular distance of 30° (see FIG. 7 to FIG. 9). The corresponding logic table is shown in Table 1 in FIG. 28. The three states N, S and w (weak signal) allow a unique allocation of the positions. If the next closest position is on the half distance between neighbouring Hall Elements the signals of these two Hall Elements are combined to perform a new weighted sine signal. With the trigonometric formula:

$$\sin(\alpha+60°/2)+\sin(\alpha-60°/2)=2\cos(60°/2)\cdot\sin(\alpha)=\sqrt{3}\sin(\alpha) \quad (1)$$

Figure 13:
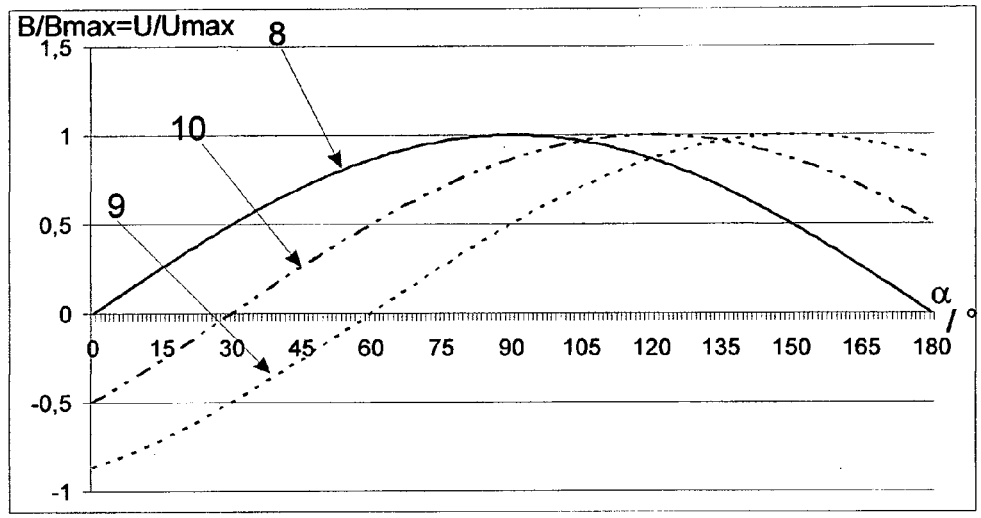
FIG. 13 shows the sine waves at Position 0°, 60° and calculated for 30°.

The sum of two neighbouring elements must be divided by $\sqrt{3}$ to get the same gain compared to a position using one Hall Element. In FIG. 13 three idealised graphs are shown, where curve 8 should be the output according to Hall Element 1 at 0°, and curve 9 should be the output according to Hall Element 2 at 60°. Curve 10 is calculated by the sum of the signal out of Hall Element 1 and Hall Element 2 divided by the square root of 3.

Figure 14:
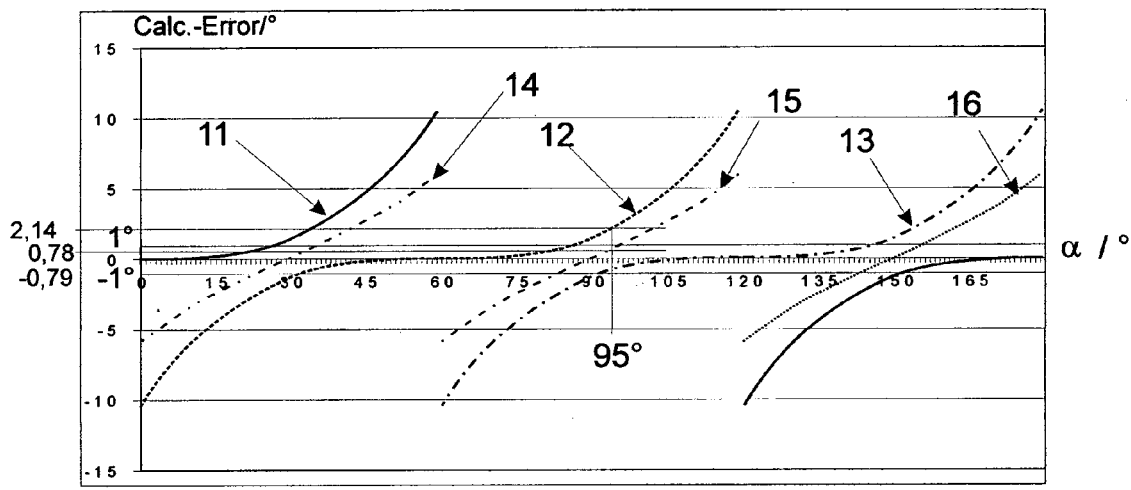
FIG. 14 shows the graphs of the approximation error by using the sensor output directly of one of three sensors at 0°, 60° and 120° or a weighted sum signal of neighbouring sensor to perform virtual signals at 30°, 90° and 150°.

We can choose the right signal or combination directly for a good approximation just setting the remaining output=prop. $\alpha$. The distance to the selected orientation should be small enough. Otherwise the error of approximation is as shown in FIG. 14. Here the section from 0° to 60° is repeated for 60° to 120° and 120° to 180° according to the signals derived from Hall Element 1 (error 11), 2 (error 12) and 3 (error 13) and the combinations of 1+2 (error 14); 2+3 (error 15) and 3+1 (error 16).

Example: The orientation of the Magnet is at a position with 95° relative to the zero orientation. With Table 1 in FIG. 28, the signals N,w,w at the three sensors of the Hall Elements (1,2,3) allow to evaluate the coarse position close to 90°. In this case Hall Element 2 at 60° and Hall Element 3 at 120° are combined by adding the corresponding two signal amplitudes which have the weak amplitude signals. The result is gained by a factor that is $1/\sqrt{3}$ times the gain of a single Hall Element.))

$$\sin(-25°)+\sin(35°)=\sqrt{3}\sin(5°)$$

$1^{st}$ approx.:

$$\sin(5°)\approx 5°=(5/180)\cdot\pi=0.087;$$

$$\sin(-25°)\approx-(25/180)\cdot\pi;\quad \sin(35°)\approx(35/180)\cdot\pi;\\(10/180)\cdot\pi/\\\sqrt{3}=0.100766\approx\sin(0.100766)=\sin(5.7735°).$$

The remaining approximation error is less than 0.78°.

Figure 15:
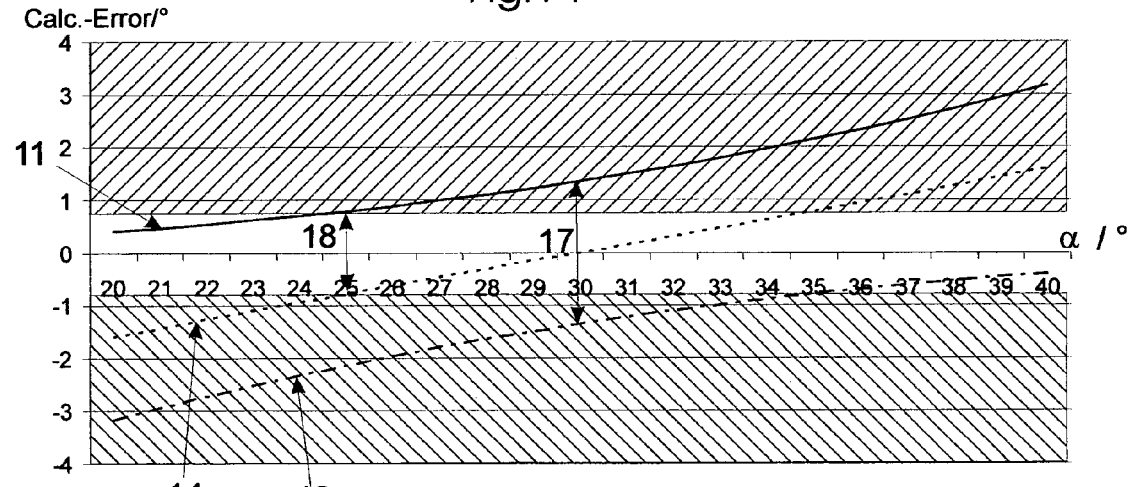
FIG. 15 is a graph that shows the approximation error using intermediate positions at 30°, 90° and 150° between the sensors 1,2,3

As shown in FIG. 15 the approximation error may be reduced by the added intermediate position from a maximum approximation error 17 of +/−1.35° (at 30°) to a maximum approximation error 18 of +/−0.78° (at 25°).

More precise calculation is possible for the cost of more complexity of the circuitry. For best approximation, the thresholds for the sections should be adjusted to switch from −25° to 25° to Hall Element 1; from 26° to 34° to the Combined Hall Elements 1 and 2; from 35° to 85° to Hall Element 2, from 86° to 94° to Hall Elements 2 and 3 and from 95° to 145° to the Hall Element 3 and from 146° to 154° to Hall Elements 3 and 1; from 155° to 205° to Hall Element 1; from 206° to 214° to Hall Elements 1 and 2; from 215° to 265° to Hall Element 2; from 266° to 274° to Hall Elements 2 and 3; from 275° to 325° to Hall Element 3 and finally from 326° to 334° equal −26° to Hall Elements 1 and 3 (see Table 1 in FIG. 28).

Doubling the number of Hall Elements to six (1,2,3,5,6,7) within 180° and angular distances of 30° would lead to configurations as shown in FIG. 10 to FIG. 12. Three examples of angular positions of the magnet target are shown at 30°, 55° and 248°. Without intermediate positions the maximum approximation error (see FIG. 19) would be less than 0.2° (error 33) and with intermediate position even less than 0.1° (error 34).

Table 2 in FIG. 29 shows 24 possible positions that are available with simple coarse estimation of the angle. According to this table, one or two Hall Elements are selected for remaining misplacement sensing.

Example: Assuming, the unknown angular position is 248° as in FIG. 12. Hall Elements 2 and 5 are sensing a signal that is larger than half the maximum value caused by the South-pole (sin 248°=−0.92; sin 218°=−0.62). Hall Elements 3 and 6 deliver a weak signal (sin 188°=−0.14; sin 158°=0.37) while Hall Elements 4 and 7 deliver a signal that is larger than half the maximum value caused by the North-pole of the magnet (sin 128°=0.79; sin 98°=0.99). The state is related to position 18 of Table 2 in FIG. 29 or 255° which is only 7° misaligned to the actual position of the magnet.

In the next step, the signals of the Hall Elements 3 and 6 (these have sensed the weak signals) are added and multiplied by a factor A which is 1/(2 cos(15°)) e.g. by analog amplifiers. The result is: (−0.14+0.37)·1/(2 cos(15°))=0.119->0.119·180°/π in corresponds to 6.82°. The result is 255°−6.82°=248.18°. The calculated error is 0.18°.

Due to imperfections of the magnet position and due to the imperfect poles positions in the magnet there will be always a further nonlinearity error in the phase difference of two neighbouring sensors independent of the approximation error described above. Interpolation of the outputs of multiple elements helps to reduce such error.

As shown in FIG. 16, six Hall Elements are arranged above or below one half of the rotating magnet. All signals of the Hall Elements 1,2,3,5,6,7 are summed to a first averaged signal, a cosine of the given orientation (cos(a)=−ΣU). The sum signal of the Hall Elements 2,5,1 in the right quarter 19 minus the sum signal of Hall Elements 6,3,7 in the left quarter 20 result in a sine signal related to the orientation of magnet 4; (sin(a)=ΣU$_{right}$−ΣU$_{left}$). The angle results out of arc tan (sin(α)/ cos(α). This calculation could be used for coarse angle estimation where the digitized output could serve as a reference for the Hall Element selection or pair of Hall Element selection as described above.

Other combinations of the arrangement in FIG. 16 for improving the measurement results could be:

Hall Elements Signals 1,2 (and 5,6; 2,3; 6,7) and compare or combine with signal of Hall Element 5 (respectively 2;6;3).

Neighbouring pairs (1,5; 2,6; 3,7; 5,2; 6,3) or one and one (1,6; 5,3; 2,7) or (1,3; 5,7)

Three by three (1,5,2; 5,2,6; 2,6,3 and 6,3,7)

Four by four (1,5,2,6; 5,2,6,3; 2,6,3,7)

The imperfections of the magnet or its position could be localized and corrected by the tracking system if a big area of the magnet is sensed.

FIG. 17 gives an example where twelve Hall Elements are oriented on a circle around the centre of the magnets rotation axis. Four quadrants (19,20,21,22) may be defined to calculate the sine and cosine signals with respect to the specified zero angle orientation. The sum of the sensed voltages of Hall Elements 1,2,5 in quadrant 19 is $U_{Q1}$, of Hall Elements 7,3,6 in quadrant 20 is $U_{Q2}$, of Hall Elements 23,26,24 in quadrant 21 is $U_{Q3}$ and of Hall Elements 27,25,28 in quadrant 21 is $U_{Q4}$. The sine signal then is defined by $U_{Q1}+U_{Q4}-U_{Q2}-U_{Q3}$ and the cosine by $U_{Q3}+U_{Q4}-U_{Q1}-U_{Q2}$. The angle α may be calculated by state of the art methods.

Or the coarse angle is evaluated by the methods described above and the new orientation is defined as shown in FIG. 18. At this orientation the remaining fine angle is close to zero, where the coarse angle is equal 45°. The coarse angle may be got by the iterative method. $1^{st}$ step is to compare the signal of all quadrants, and choose the binary code of the quadrant with the lowest amplitude for the most significant two bit $D_3D_2$, where Q1=00; Q2=01; Q3=10 and Q3=11. Here the bits are 00. In a $2^{nd}$ step, the element with the lowest amplitude out of the three in the found quadrant is found by comparison of Hall Elements 1,2,5 (these give the lower significant two bits $D_1D_0$ (code 01,11,10)). Here the result is 10 for the lower two bits. Since here 12 elements are used the code must be corrected by subtracting the two most significant bits.

$(D_3D_2D_1D_0-D_3D_2)=P_3P_2P_1P_0$ the binary representation of the coarse Position, here:

$0010_2-00_2=0010_2$ is position 2 (of twelve) according to 2·30°−15°=45°.

The fine angle is than given by $(U_{Q1'}+U_{Q4'})-(U_{Q2'}+U_{Q3'})$ where the quadrants Q1' to Q4' (29,30,31,32) are within the rotated coordinate system. Here $(U_6+U_2+U_5+U_1+U_{28})-(U_7+U_{23}+U_{26}+U_{24}+U_{27})=U_{sin}≈U_{\alpha'}$ and with U $(\alpha'=15°)=U_{max}$ and with 6 bit Resolution ($2^6=64$ steps) A/D conversion allows to output the fine values in steps of multiples of 15°/64=0.234°.

The overall resolution in this example would be close to 10 bit with an approximation error of less than 0.17° (max. 1 LSB least significant bit).

Twelve coarse positions can be calculated with:

$2[\sin(\alpha+15°)+\sin(\alpha-15°)+\sin(\alpha+45°)+\sin(\alpha-45°)+\sin(\alpha+75°)+\sin(\alpha-75°)]=2\ [2\cos(15°)·\sin(\alpha)+2\cos(45°)·\sin(\alpha)+2\cos(75°)·\sin(\alpha)]=4·\sin(\alpha)·(\cos(15°)+\cos(45°)+\cos(75°))≈7.727\sin(\alpha)$ where α is the remaining misalignment at the found coarse position (see FIG. 18)

or if the coordinate basis is rotated by 15°:

$2[\sin(\beta)+\sin(\beta+30°)+\sin)+(\beta-30°)+\sin(\beta+60°)+\sin(\beta-60°)+\sin(\beta+90°)+\sin(\beta-90°)]=2\ [\sin(\beta)+2\cos(30°)·\sin(\beta)+2\cos(60°)·\sin(\beta)+2\cos(90°)·\sin(\beta)]=4·\sin(\beta)·(½+\cos(30°)+\cos(60°))≈7.746\sin(\beta)$, (see FIG. 20)

Due to this 24 coarse positions might be defined using both orientation positions. In this case the approximation error might be reduced to less than 0.088°, (see FIG. 19)

In this case two different measurement amplitudes (see calculations above 7.727 or 7.746) need to be considered, if the selected coordinate axis are going through the centre of the Hall Elements see FIG. 20 the amplitude is slightly higher compared to FIG. 17 where the axis are parallel to the second possible symmetry axis. Again here the sine signal represents the misalignment of the position reflecting the fine angular resolution.

FIG. 21 shows a block diagram of an integrated sensor device according to the presented method. Having 16 sensors in equidistant angles at a constant radius, the iterative method allows to approach to a separation of 7 or 8 sensors in one half and 7 or 8 sensors in the other half with a coarse resolution of δ/2=360°/32=11.25°.

The remaining misalignment of +/−5.625° is given by the sensed amplitude including a sine approximation error. The reason for 32 possible steps is given by the opportunity to position the separation axis either through the centre of a sensor element or through the centre of two neighbouring sensor elements.

Figure 22:
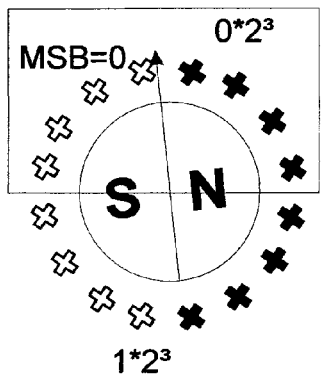
Figure 23:
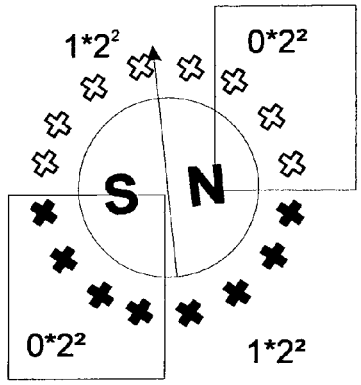
Figure 24:
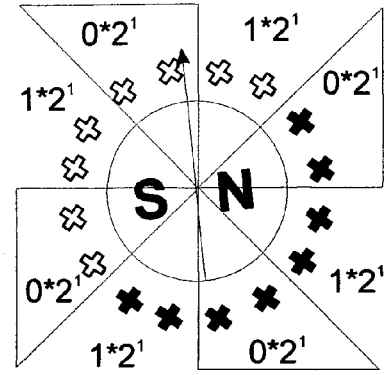
Figure 25:
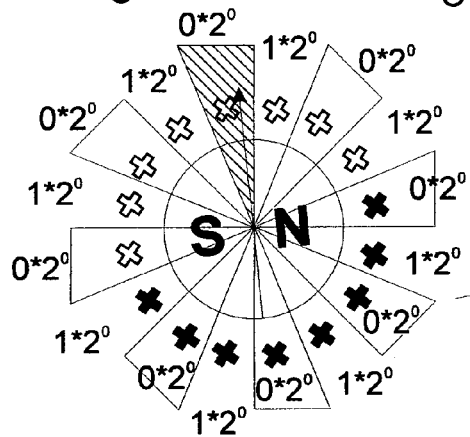
Figure 26:
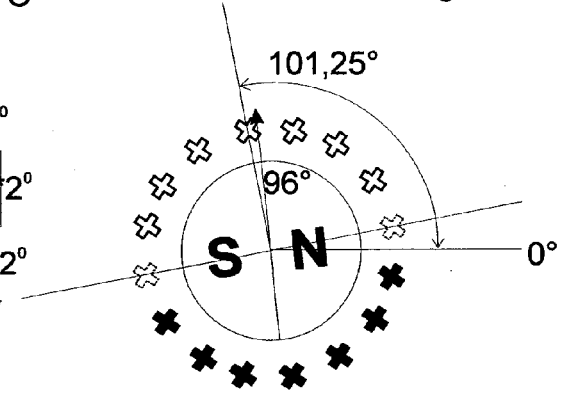

The example shows the position 96° counter clockwise shifted from the indicated α=0° reference position. First, if the sum of signals of the right side is larger than the sum of the signals of the left side of an axis that is 90° rotated from zero, then angular is below 180° (FIG. 22). The switching unit 36 combines the required sensor elements of the sensor frontend 35. The most significant bit is set to 0, otherwise this bit is set to 1. Then, if the braking condition of block 38 is not reached, the second significant bit is calculated by subtracting all signals of the elements in the lower half, from those of the upper half of the circle (=cosine). A positive signal indicates an angular lower than 90° or higher than 270° (FIG. 23). This procedure is also done for the sensor signal sums right and left of an axis with an angular of 45° and finally with the signals right and left of an axis with an angular of 22.5° (FIG. 24 and FIG. 25). These four signal evaluations result in a 4 bit value C. Here C is $0100_2=4_{10}$. The lower limit of the coarse angular is C*δ here 4·22.5°=90°, the upper limit is (C+1)*δ, here (4+1)·22.5°=112.5° (FIG. 25). Both values are compared to each other by setting the corresponding output values of the two combinations. Here 90° is closer to 96° than 112.5°, so normally the 90° arrangement is chosen to get the coarse value that is represented in the address output unit 37. For further restriction of the coarse angle, an axis could go directly through the limiting elements as in FIG. 26. By summing up only 7 and opposite 7 Hall Element Signals the corresponding angle would be a sine of 101.25° where the amplitude needs to be corrected. Here the 96° is closest to 101.25°. The alternative coarse value C' is 101.25° and calculated by (2*C+x)*δ/2° (out of iterative approximation +11.25° out of alternative configuration. The fine angular value is proportional to the remaining signal sin(5.25°). By an A/D-converter 39, F is the fine resolution of the coarse LSB and depending on the resolution of the A/D converter.

Another interesting application would be, to have one arrangement where the Hall Elements are positioned at the angles 15°, 45°, 75°, 105°, 135°, 165° (compare FIG. 16) and 180°, 210°, 240°, 270°, 300° and 330° (compare FIG. 10-12, with 180° rotational shift). By using also the field of the second half of the magnet, this allows the same result as if 12 sensors would be only below one half of the magnet with constant angular distant of 15°. The consequence is an approximation error of 0.0214° (sin 7.5° compared to 7.5°·π/180°). The same result can also be got by Hall Elements organised at constant radiuses at angles (0°, 60°, 120° and (120°), 180°, 240° and 195°, 255° and 315°. In this case a first half of the magnet is sensed by three Hall Elements, the second half is sensed by further three Hall Elements and two additional sensors are sensing a half of the magnet which is orthogonal to the first two halves. In this case only eight Hall Elements are required to achieve a good linearity with less than 0.03° approximation error of the remaining angular misplacement if the element with the closest angular distance to the orientation of the magnet is selected.

The invention claimed is:

1. Method for sensing rotation and angular position using a plurality of magnetic field sensing elements on a single integrated circuit and using a rotating movable magnetic target above or below this circuit wherein the magnetic field strength of this target shows a gradient in a first orientation axis orthogonal to the rotation axis and parallel to the integrated circuit's surface and does not show a significant gradient in the magnetic field strength along a second orientation axis that is orthogonal to the first orientation axis and parallel to the integrated circuit's surface comprising the tracking of the orientation and positioning with the steps:
  i. coarse determination of the orientation of the magnetic target relative to the sensing elements by combining signals of the plurality of magnetic field sensing elements
    a) arithmetically by summing signals out of a first combination of the sensing elements to derive an approximately sine signal representation of the actual magnetic target's orientation and where one 360° rotation of the magnetic target results in one sine wave cycle—and—summing signals out of a second combination of the sensing elements which intentionally derive a 90 degree shifted signal compared to the first of the magnetic target thus both combinations allow the angular calculation by deriving the arc tangent,—or
    b) logically by using comparators and window comparators to get a maximum value or alternatively a minimum value out of the summed signals of the sensor elements relative to the absolute orientation of the integrated circuit and using a predefined value table of at least some combinations of magnetic field sensing elements to define the angular difference, then
  ii. recombining the plurality of the magnetic field sensing elements arithmetically and/or logically in a suitable way conditioned of the results of step i. to get an improved signal since in this way the tracked orientation of the combination of the magnetic fielding sensing elements has the smallest angular distance to the orientation given by direction starting from the rotation centre of the magnetic target and pointing to the sensing place of the maximum magnetic gradient orthogonal to the rotation axis, and finally
  iii. computing a remaining misalignment of the magnetic target's orientation, with respect to the orientation of the chosen magnetic fielding sensing element or to a selected combination of magnetic fielding sensing elements.

2. The method according to claim 1, wherein a first orientation is determined by sensing a polarity of the magnetic target above or below the plurality of magnetic field sensing elements using three possible states per sensor: North, South and a Weak Signal in between under the usage of combinatorial logic.

3. The method according to claim 1, wherein the coarse orientation is determined by detecting a positive or negative maximum value of the magnetic field strength or a zero-crossing of the signal instead by comparing an amplitude of each sensing element's output with a pre-selected threshold or amplitude-window, or by comparing to each other among the outputs from the plurality of magnetic sensing elements.

4. The method according to claim 1, wherein the coarse orientation is determined by detecting a positive or negative maximum value of the magnetic field strength or a zero-crossing by comparing the amplitude of a combination value of the plurality of sensing elements with a predefined threshold or amplitude window, or by comparison to values of other combinations of the sensing elements and using the corresponding arithmetical mean of the topographical angular position value.

5. The method according to claim 4, wherein the angular position value is represented in a stored table which assigns to each sensing element or each possible combination of sensing elements a coarse absolute position value which represents the physical position of the element or the geometrical center of the corresponding combination of the sensing elements.

6. The method according to claim 1, wherein the combination of magnetic field sensing elements is performed by analog summation or analog subtraction of the output signals of selected sensing elements.

7. The method according to claim 1, wherein the coarse orientation is computed by separating the plurality of magnetic sensing elements into two sectors whose first and second summation signals are positioned to get the mean value of the magnetic field within the area below or above two neighboring quadrants of the magnetic target resulting in a sine signal incorporation at the first summation signal output and a cosine signal incorporation at the second summation signal output.

8. The method according to claim 1, wherein the coarse orientation is computed by combining the plurality of magnetic sensing elements within four physical quadrants around the rotation axis of the magnetic target, where the four summation signals of the sensing elements are computed in a way where the first two quadrants for example in a counter clockwise consideration minus the summation signals of the second two quadrants form a signal that is 90° shifted to a summation signal of the magnetic sensing elements of the second and third quadrant minus the summation signal of the first and fourth quadrant, thus forming a sine and a cosine signal with respect to the magnet position above, below or within the center of the quadrants.

9. The method according to claim 1, wherein the comparison of a remaining upper and a lower threshold misalignment signal output are used to either switch to the neighboring sensing element or to a combination of those sensing elements that represents the closest neighboring angle orientation, and especially by already known iterative approaches to achieve the lowest possible difference signal.

* * * * *